United States Patent [19]

Sichmann et al.

[11] Patent Number: 5,068,021
[45] Date of Patent: Nov. 26, 1991

[54] DEVICE FOR COATING A POLYMETHYLMETHACRYLATE SUBSTRATE WITH ALUMINUM

[75] Inventors: Eggo Sichmann, Gelnhausen; Wolf-Eckart Fritsche, Kleinostheim; Jim Schlüssler, Gruendau, all of Fed. Rep. of Germany

[73] Assignee: Leybold Aktiengesellschaft, Hanau, Fed. Rep. of Germany

[21] Appl. No.: 510,043

[22] Filed: Apr. 17, 1990

[30] Foreign Application Priority Data

Feb. 10, 1990 [DE] Fed. Rep. of Germany ....... 4004116

[51] Int. Cl.$^5$ .............................................. C23C 14/34
[52] U.S. Cl. ........................... 204/192.14; 204/298.07
[58] Field of Search ...................... 204/192.14, 298.07

[56] References Cited

U.S. PATENT DOCUMENTS 4,816,124 3/1989 Manabe et al. ................ 204/192.14
4,961,832 10/1990 Shagun et al. ................. 204/298.07

FOREIGN PATENT DOCUMENTS 221204 4/1985 German Democratic
   Rep. .................................. 204/192.14
59-16227 9/1984 Japan .
1-09731 1/1989 Japan .

Primary Examiner—Aaron Weisstuch
Attorney, Agent, or Firm—Felfe & Lynch

[57] ABSTRACT

In a process for coating a plastic substrate 1 made of polymethylmethacrylate with metal using a direct current source 10 connected to an electrode disposed in an evacuable coating chamber 15, 15a and electrically connected to a target 3 to be sputtered, the adhesiveness and the service life of the layer are improved. In a first coating step, an argon plasma is maintained in the coating chamber 15, 15a for an extremely short period of time preferably until the so generated sputtering process passes from the oxidic to the metallic process. In a second coating step, helium is introduced in the coating chamber 15, 15a and a helium plasma is ignited. In a third coating step, argon is introduced into the coating chamber 15, 15a and an argon plasma is ignited and this argon plasma process is maintained until a desired thickness is reached.

9 Claims, 1 Drawing Sheet

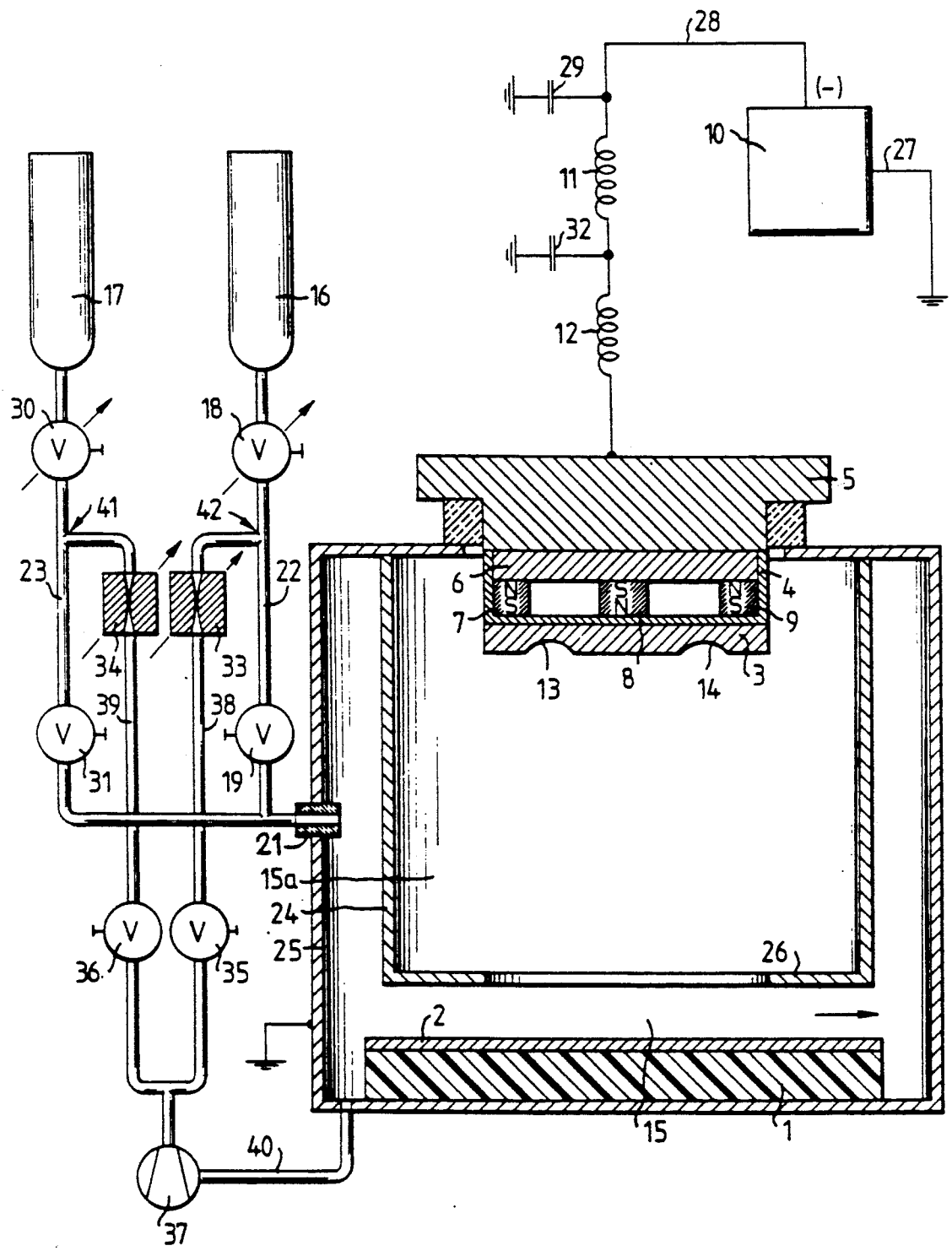

DEVICE FOR COATING A POLYMETHYLMETHACRYLATE SUBSTRATE WITH ALUMINUM

BACKGROUND OF THE INVENTION

The invention relates to a process and a device for sputter coating a plastic substrate, preferably a polymethylmethacrylate substrate, with metal, particularly aluminum, by means of a direct current source. This direct current source is connected to an electrode disposed in an evacuable coating chamber and the electrode in turn is connected to a target which is sputtered and the sputtered particles are deposited on the substrate. A process gas is introduced into the coating chamber which can be connected via a gas supply line to a cylinder filled with argon and to a cylinder filled with helium. Valves for the metered supply of the gases to the coating chambers are interposed in the gas supply lines.

In known processes, an aluminum layer is directly sputtered onto a plastic substrate, e.g. on polycarbonate, without an intermediate or adhesive layer.

Disadvantageously, only substrates of limited dimensions can be sputtered in this process since the polycarbonate is birefringent after a certain substrate size so that information on video or audio-CD-disks, for example, can no longer be sensed fault-free.

A particular problem arises when coating plastics of the group of polymethylmethacrylates, which, for example, are commercially available as "Plexiglass." Here, due to the high sensitivity of this material to ultraviolet radiation, the sputtered layer exhibits a low adhesiveness. The plasma, as a matter of fact, when sputtering with noble gases like neon, argon, krypton and xenon, does predominantly emit ultraviolet radiation in a wavelength range between 70 and 125 nm.

SUMMARY OF THE INVENTION

It is hence an object of the present invention to provide a device which significantly improves the adhesiveness of a sputtered aluminum layer on the plastic substrate without requiring essential or expensive changes and modifications of conventional and already available devices and systems.

In a first sputtering step, an argon plasma is maintained in the coating chamber for an extremely short period of time, preferably until the so generated sputtering process passes from the oxidic process to the metallic process. In a second coating step, helium is introduced into the coating chamber and a helium plasma is ignited. In a third coating step, argon gas is introduced into the coating chamber and an argon plasma is ignited and this argon-plasma-process is maintained until a desired layer thickness is reached.

For performing the process in accordance with the invention, each gas supply line is advantageously connected to a pump-down line in each of which is interposed a check valve and to each of which a vacuum pump can be connected.

In each pump-down line, a throttle valve is advantageously interposed in the line segment between the line branching with the appertaining gas supply line, on the one side, and the check valve, on the other side.

BRIEF DESCRIPTION OF THE DRAWING

The sole FIGURE illustrates the sputtering apparatus for the coating of plastic substrates.

The drawing shows a plastic substrate 1 to be provided with a thin aluminum layer 2 located opposite a target 3 to be sputtered. An element 4 having a U-like cross section connects the target 3 to an electrode 5 which rests on a yoke 6. Three permanent magnets 7, 8, 9 are enclosed between this yoke and the element 4. The polarities of the poles of the three permanent magnets 7, 8, 9 directed to the target 3 alternate so that together with the north pole of the center permanent magnet 8, the south poles of the two outer permanent magnets 7, 9 form an approximately arcuate magnetic field across the target 3. This magnetic field condenses the plasma before the target 3 sueh that it has its greatest density where the magnetic fields have the maxima of their arc. The ions in the plasma are accelerated by an electric field which is generated by a direct voltage supplied by a direct voltage source 10. With its negative pole, this direct current source 10 grounded by line 27 is connected to electrode 5 via line 28 having series inductances 11, 12. The line 28 is connected to ground ahead of the first inductor 11 via a capacitor 29, and between the inductors 11, 12 via a capacitor 32. The electric field is perpendicular to the surface of the target 3 and accelerates the positive ions of the plasma in direction toward this target 3 which is disposed in the process chamber 25, i.e. in a vessel 24. A more or less great number of atoms or particles are thus ejected from the target 3, in particular, from the areas 13, 14 where the magnetic fields have their maxima. The sputtered atoms or particles travel in direction toward the substrate 1 which is below the diaphragm 26 on the bottom of the vessel 25 where they are deposited as a thin layer 2. A process computer which processes data and releases control commands can be provided for the control of the represented arrangement. The values of the partial pressure measured in the coating chamber 15, 15a can be supplied to this process computer, for example. Based on this and other data, the computer can control, for example, the helium flow at cylinder 16 or the argon flow from cylinder 17 via valves 18, 19 interposed in supply line 22 and via valves 30, 31 interposed in supply line 23 and thus adjust the voltage at cathode 5. The process computer is also able to monitor all other variables, for example, the power supply. Since process computers of this kind are known, a description of their design is omitted here.

The adhesiveness of the layer 2 on the polymethylmethacrylate substrate 1 is significantly increased with the use of helium as a process gas until a layer thickness is reached, e.g. 350–400 Å of aluminum, which is no longer permeable to the ultraviolet radiation of the subsequent argon process.

In a first phase of the process an argon plasma is maintained for the sputtering process in the coating chamber 15, 15a during an extremely short period of time until the so generated sputtering process, particularly by the degassing of the PMMA-substrate, passes from the oxidic to the metallic phase. Subsequently, in a second phase of the process, helium is introduced into the coating chamber 15, 15a via supply line 22 so that a helium plasma can be ignited. Subsequently, for a third process phase, argon is introduced again into the coating chamber 15, 15a via supply line 23 and an argon plasma is ignited. This argon plasma process is maintained until a desired thickness of the layer 2 is reached.

For a quick rinsing or pumping down of the coating chamber and the individual gas supply lines 22, 23 and the inlet 21 upon completion of the individual process phases (I–III), a special vacuum pump 37 is connected via the connections 41, 42 and pump-down lines 38, 39 to lines 22, 23 and via line 40 to the coating chamber 15, 15a. The pump-down lines 38, 39 are provided with valves 35, 36 which, in case the valves 18, 30 are open, prevent gas from escaping from the cylinders 16, 17 directly to the exterior. In order to reduce the amount of gas emerging from the pipes 22, 23, throttle valves 33, 34 are interposed in the pump-down lines 38, 39.

EXAMPLE

Coating a PMMA-CD with aluminum 1. coating step: "substrate-target-preparation"

An extremely short-lived Ar-plasma is maintained until the coating has passed from the oxidic to the metallic sputtering.

Reason: PMMA strongly degasses during the beginning of the coating. Due to the high sputter yield, an Ar-plasma proves to be uncritical against oxidation and the target remains "clean" despite degassing. There is no significant coating taking place. Due to the higher sputtering rate when sputtering with Ar, the surface is "sealed" with a thin film of Al so that the degassing of the PMMA-substrate is prevented.

2. coating step: "Protective layer against ultraviolet radiation"

This layer (ca. 400 Å) is applied with a He-plasma. Since there is practically no more degassing due to step 1, a He plasma can be immediately ignited without reaching the critical oxidic state.

3. coating step: "Normal layer"

Because of coating step 2, the PMMA substrate is protected against ultraviolet radiation and a conventional plasma can be ignited until the desired layer thickness is reached.

Substrate load and layer thickness of the individual layers at a total thickness of ca. 1000 Å (Total coating time ca. 7 sec.)

|  | Layer thickness (Å) | Substrate load (%) |
|---|---|---|
| Step 1. Ar plasma: | 0 | <1 |
| Step 2. He plasma: | ca. 400 | 91 |
| Step 3. Ar plasma: | ca. 600 | 8 |

We claim:

1. Sputtering process for coating a plastic substrate with metal by means of a direct current source connected to an electrode connected to a target of said metal in an evacuable coating chamber, said process comprising the following steps during the sputtering of said target to coat said substrate:

a first coating step in which argon is introduced into said chamber and an argon plasma is ignited and maintained until the process passes from the oxidic phase to the metallic phase, whereupon said chamber is evacuated, a second coating step in which helium is introduced into said chamber and a helium plasma is ignited and maintained until said substrate has a coating of sufficient thickness to protect said substrate against the ultraviolet radiation emitted during sputtering in an argon plasma, whereupon said chamber is evacuated, and a third coating step in which argon is introduced into the coating chamber and an argon plasma is ignited and maintained until a desired coating thickness is attained.

2. Process as in claim 1 wherein said plastic is polymethylmethacrylate.

3. Process as in claim 1, wherein during said second coating step, said helium plasma is maintained until said coating has a thickness of 350 to 400 Å.

4. Process as in claim 1, wherein said metal is aluminum.

5. Apparatus for sputter coating a plastic substrate with metal, comprising an evacuable coating chamber, vacuum pump means directly connected to said coating chamber an electrode disposed in said coating chamber and connected to a direct current source, a target in said coating chamber adapted to comprise said metal and electrically connected to said electrode, a first gas supply line directly connected to said chamber for supplying a first gas thereto, said first gas supply line having valve means therein for the metered supply of said first gas to said coating chamber, a second gas supply line directly connected to said chamber for supplying a second gas thereto, said second gas supply line having valve means therein for the metered supply of said second gas to said coating chamber, a first pump-down line connecting said first gas supply line via a tee-connection to said vacuum pump means and having a check valve therein, and a second pump-down line connecting said second supply line via a tee-connection to said vacuum pump means and having a check valve therein.

6. Apparatus as in claim 5 further comprising a throttling valve in said first pump-down line between said first gas supply line and said check valve in said first pump-down line and a throttling valve in said second pump-down line between said second supply line and said check valve in said second pump-down line.

7. Apparatus as in claim 6 wherein said throttling valve and said check valve in each pump down line are electrically actuated.

8. Apparatus as in claim 5 wherein said valve means in each supply line comprises a pair of serially arranged valves, said pump-down lines being connected between the respective pairs of valves.

9. Apparatus as in claim 8 wherein said valves in said supply lines are electrically actuated.

* * * * *